(12) United States Patent
Bailey et al.

(10) Patent No.: US 9,686,882 B2
(45) Date of Patent: Jun. 20, 2017

(54) MODULAR DATA CENTER CABINET RACK GUIDE AND RETENTION MECHANISM

(71) Applicant: Dell Products, LP, Round Rock, TX (US)

(72) Inventors: Mark M. Bailey, Round Rock, TX (US); Anthony P. Middleton, Round Rock, TX (US)

(73) Assignee: Dell Products, LP, Round Rock, TX (US)

( * ) Notice: Subject to any disclaimer, the term of this patent is extended or adjusted under 35 U.S.C. 154(b) by 196 days.

(21) Appl. No.: 14/279,801

(22) Filed: May 16, 2014

(65) Prior Publication Data

US 2015/0334866 A1    Nov. 19, 2015

(51) Int. Cl.
| H05K 7/14 | (2006.01) |
| H05K 5/02 | (2006.01) |
| H05K 7/18 | (2006.01) |

(52) U.S. Cl.
CPC ......... *H05K 7/1489* (2013.01); *H05K 5/0217* (2013.01); *H05K 5/0234* (2013.01); *H05K 7/1488* (2013.01); *H05K 7/183* (2013.01)

(58) Field of Classification Search
CPC ...... A47B 53/02; A47B 53/00; H05K 7/1497; H05K 7/1488; H05K 7/18; H05K 7/183; H05K 7/1485; H05K 5/0234; H05K 7/1489; H05K 5/0217
USPC .... 312/201, 334.23, 334.24, 334.27, 334.28, 312/334.32
See application file for complete search history.

(56) References Cited

U.S. PATENT DOCUMENTS

| 5,443,312 | A | * | 8/1995 | Schluter | H05K 7/1488 312/201 |
| 5,597,217 | A | * | 1/1997 | Hoska | A47B 53/02 104/242 |
| 6,027,190 | A | * | 2/2000 | Stewart | A47B 53/00 312/201 |
| 6,636,418 | B1 | * | 10/2003 | Claprood | G06F 1/181 248/188.4 |
| 7,699,180 | B2 | * | 4/2010 | Mollard | B65D 19/44 211/26 |
| 8,371,666 | B2 | * | 2/2013 | Wu | H05K 7/1497 312/334.24 |
| 8,607,996 | B2 | * | 12/2013 | Yang | H05K 7/1488 211/162 |
| 2003/0011976 | A1 | * | 1/2003 | Treiber | G06F 1/181 361/727 |
| 2006/0232174 | A1 | * | 10/2006 | Muth | A47B 53/02 312/198 |
| 2008/0156758 | A1 | * | 7/2008 | Mollard | B65D 19/44 211/151 |
| 2009/0179532 | A1 | * | 7/2009 | Pan | A47B 53/00 312/201 |

(Continued)

*Primary Examiner* — Patrick Hawn
(74) *Attorney, Agent, or Firm* — Larson Newman, LLP

(57) ABSTRACT

A modular data center includes a first alignment component, and a second alignment component. The first alignment component is mounted at a first location on a floor of the modular data center, and is configured to align a cabinet rack within a rack slot of the modular data center. The second alignment component is mounted at a second location on the floor, and is configured be placed in physical communication with the cabinet rack in response to the cabinet rack being fully inserted in the rack slot.

14 Claims, 8 Drawing Sheets

(56) References Cited

U.S. PATENT DOCUMENTS

| | | |
|---|---|---|
| 2011/0094978 A1 | 4/2011 | Bailey et al. |
| 2011/0284711 A1* | 11/2011 | Hsiao ................... B65D 19/38 |
| | | 248/346.03 |
| 2012/0104918 A1* | 5/2012 | Peng ................... H05K 7/1497 |
| | | 312/334.27 |
| 2012/0116590 A1 | 5/2012 | Florez-Larrahondo et al. |
| 2012/0293932 A1 | 11/2012 | Jai |
| 2013/0039006 A1 | 2/2013 | Li et al. |
| 2013/0063894 A1 | 3/2013 | Wang |
| 2013/0214654 A1* | 8/2013 | Yang ................... H05K 7/1489 |
| | | 312/201 |
| 2014/0139080 A1* | 5/2014 | Pan ....................... A47B 46/00 |
| | | 312/201 |

* cited by examiner

MODULAR DATA CENTER CABINET RACK GUIDE AND RETENTION MECHANISM

FIELD OF THE DISCLOSURE

This disclosure generally relates to information handling systems, and more particularly relates to a modular data center cabinet rack guide and retention mechanism.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements can vary between different applications, information handling systems can also vary regarding what information is handled, how the information is handled, how much information is processed, stored, or communicated, and how quickly and efficiently the information can be processed, stored, or communicated. The variations in information handling systems allow for information handling systems to be general or configured for a specific user or specific use such as financial transaction processing, airline reservations, enterprise data storage, or global communications. In addition, information handling systems can include a variety of hardware and software components that can be configured to process, store, and communicate information and can include one or more computer systems, data storage systems, and networking systems.

A data center operates a large number of information handling systems to provide storage and processing for a large number of smaller client systems. A modular data center is a portable version of a data center that provides an easily expandable computing capacity that is quick to set up and to get operational, without having the building construction and infrastructure worries typically associated with a traditional data center. A modular data center includes multiple rack cabinets, which can each hold multiple servers or information handling systems.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

Figure 1:
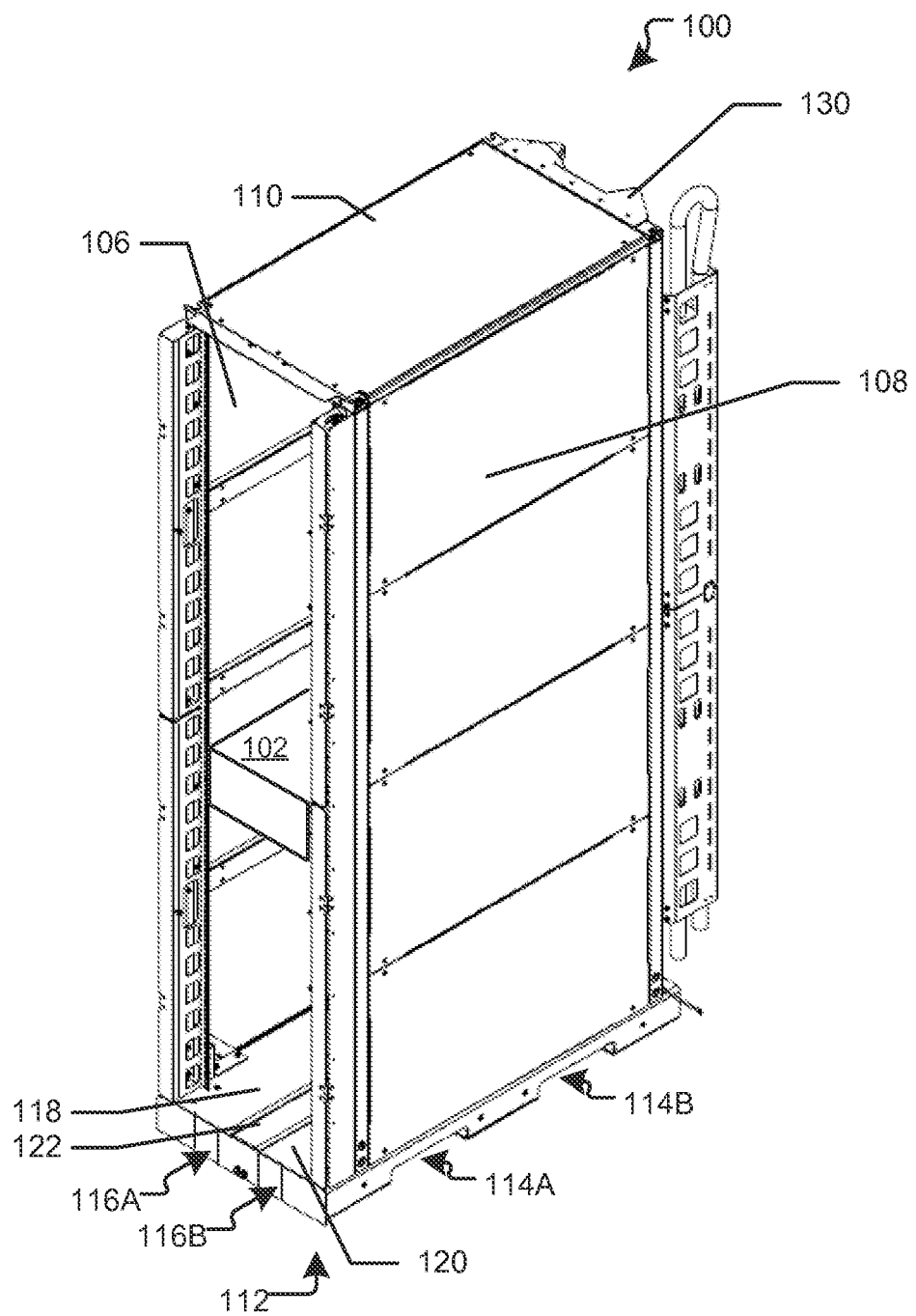
FIGS. 1-3 are diagrams showing different perspective views of a cabinet rack.
Figure 2:
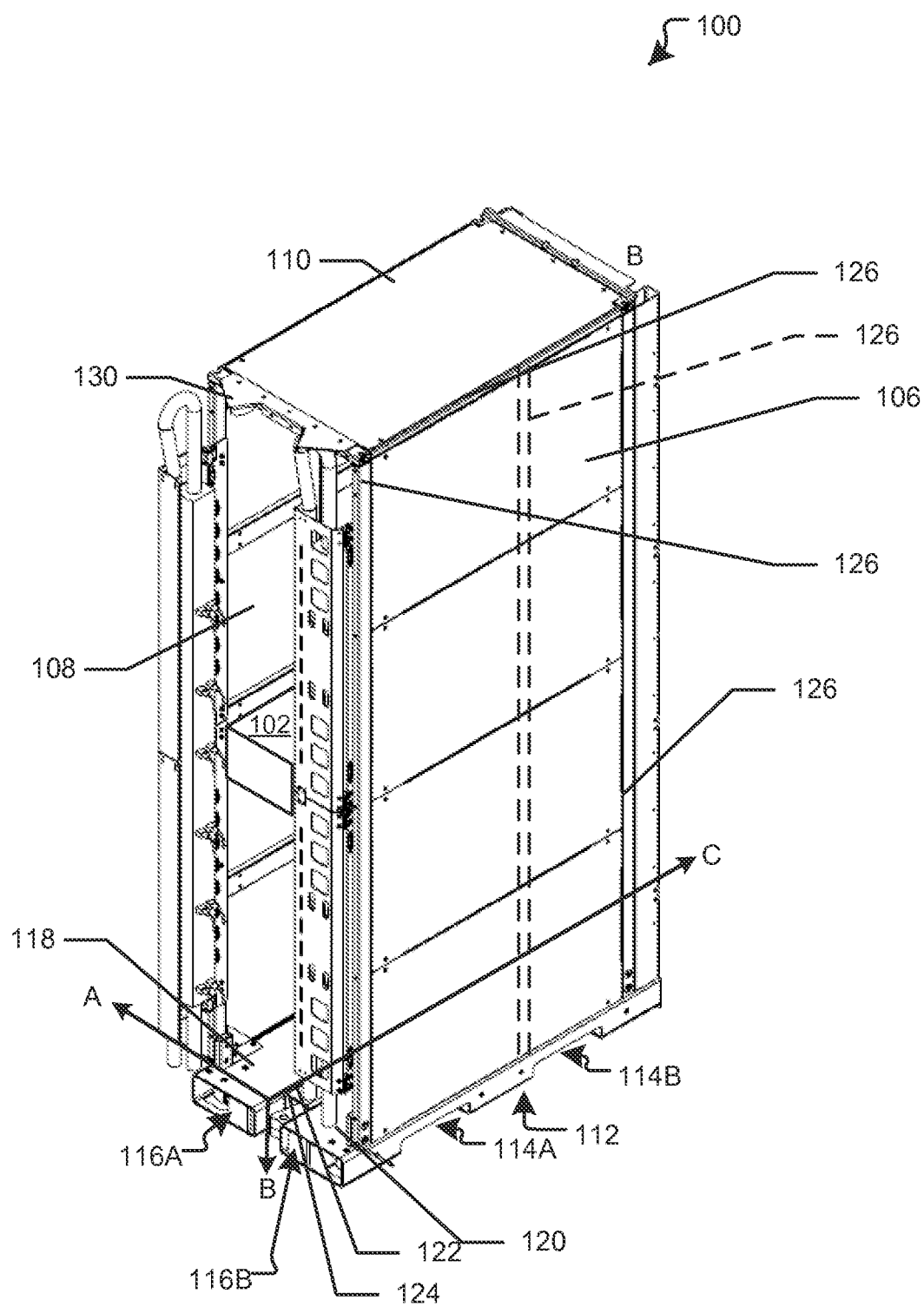
Figure 3:
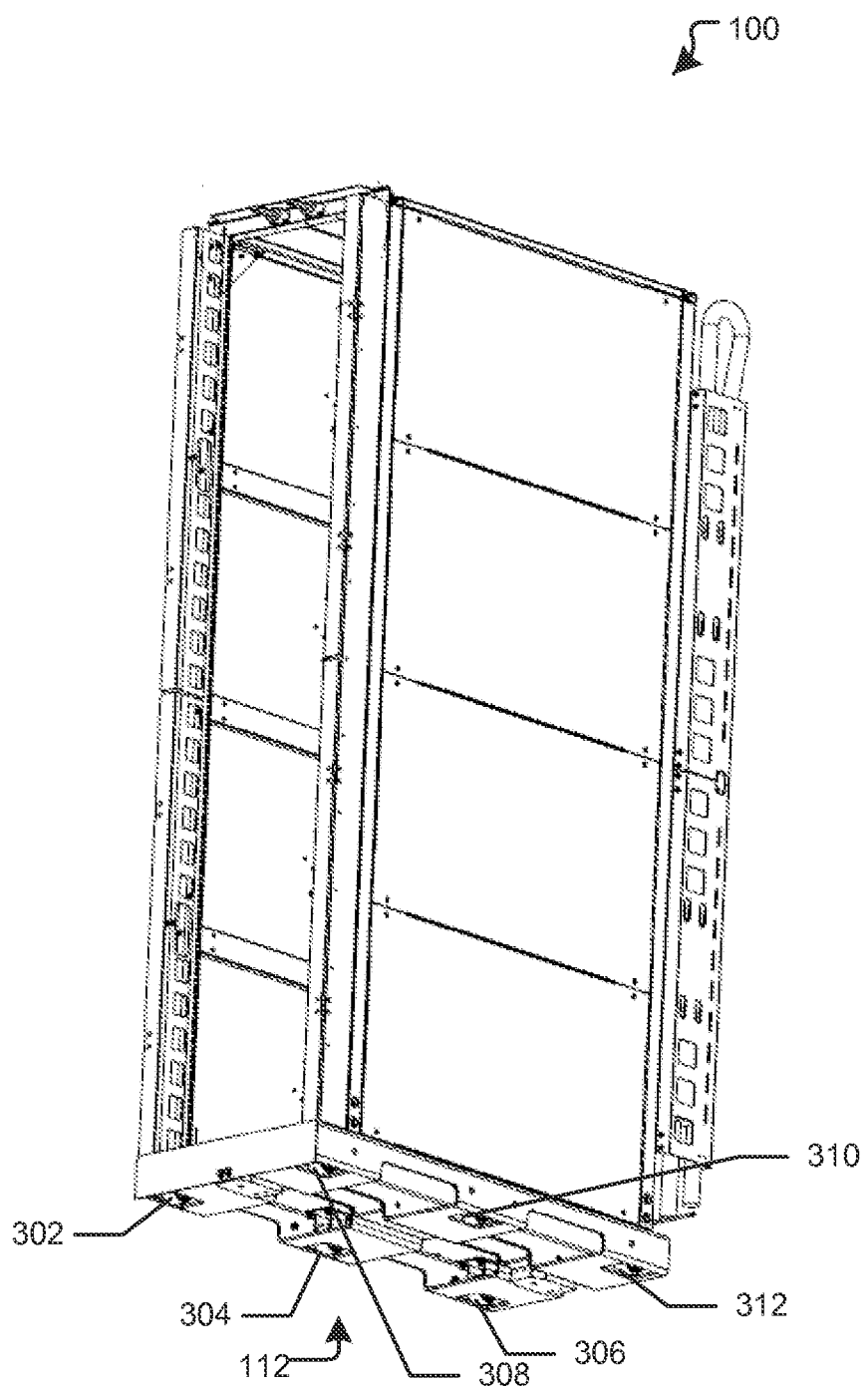

FIGS. 1-3 illustrate a rack cabinet 100 to hold one or more information handling systems, such as server 102. For purposes of this disclosure, the information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network server or storage device, a switch router or other network communication device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

The cabinet rack 100 includes sides 106 and 108, a top 110, and a base 112. The cabinet rack also includes a frame 126 to support the weight of information handling systems, such as server 102, and to provide structural support for sides 106 and 108, and the top 110. The base 112 includes side fork lift pockets 114A and 114B, inline fork lift pockets 116A and 116B, side beams 118 and 120, a center beam 122, an alignment channel 124, a bracket 130, and casters 302, 304, 306, 308, 310, and 312 (302-312). In the embodiment described herein, the cabinet rack 100 can be placed within and integrated into a modular data center along with multiple other cabinet racks. The modular data center can then be transported to a desired location to provide on-site processing/storage capabilities. In other embodiments, the cabinet rack 100 can be utilized in any type server room or other location one or more racks of servers are utilized.

The cabinet rack 100 is designed to hold a large number of information handling systems including server 102, such that the frame 126 and base 112 can thereby support a large amount of weight. For example, the structural design of the frame 126 and the base 112 can support up to five thousand pounds. The possibility that the cabinet rack 100 can weigh upwards of five thousand pounds can make it difficult to move the cabinet rack around on the casters 302-312 if the casters swivel in different directions. For example, the weight of the cabinet rack 100 could bind the casters 302-312, such that the casters cannot swivel. Thus, the casters 302-312 can be unidirectional casters that can make is possible to roll/translate the cabinet rack 100 in a single direction. Therefore, the side fork lift pockets 114A and 114B, and the inline fork lift pockets 116A and 116B can be utilized by a user to move the cabinet rack 100 in multiple directions to get the cabinet rack into and out of a modular data center. For example, while the cabinet rack 100 is outside of the modular data center, the user can insert a fork lift into the inline fork lift pockets 116A and 116B to pick up and move the cabinet rack to the modular data center.

When the cabinet rack 100 is placed within the modular data center, the user can then insert a device, such as a low profile pallet jack, into the side fork lift pockets 114A and 114B. A user can then lift and move the cabinet rack 100 in a direction that is perpendicular to casters within the base 112 and place the cabinet rack in front of a particular rack slot in the modular data center. The user can then remove the pallet jack from the side fork lift pockets 114A and 114B, and can roll the cabinet rack 100 into the rack slot on the casters 302-312. In an embodiment, the modular data center can include alignment components, such as front alignment component 404 and back alignment component 406 of FIG. 4, which can slide within the alignment channel 124 of the base 112 to ensure that the cabinet rack 100 is properly aligned and retained within the rack slot of the modular data center.

Figure 4:
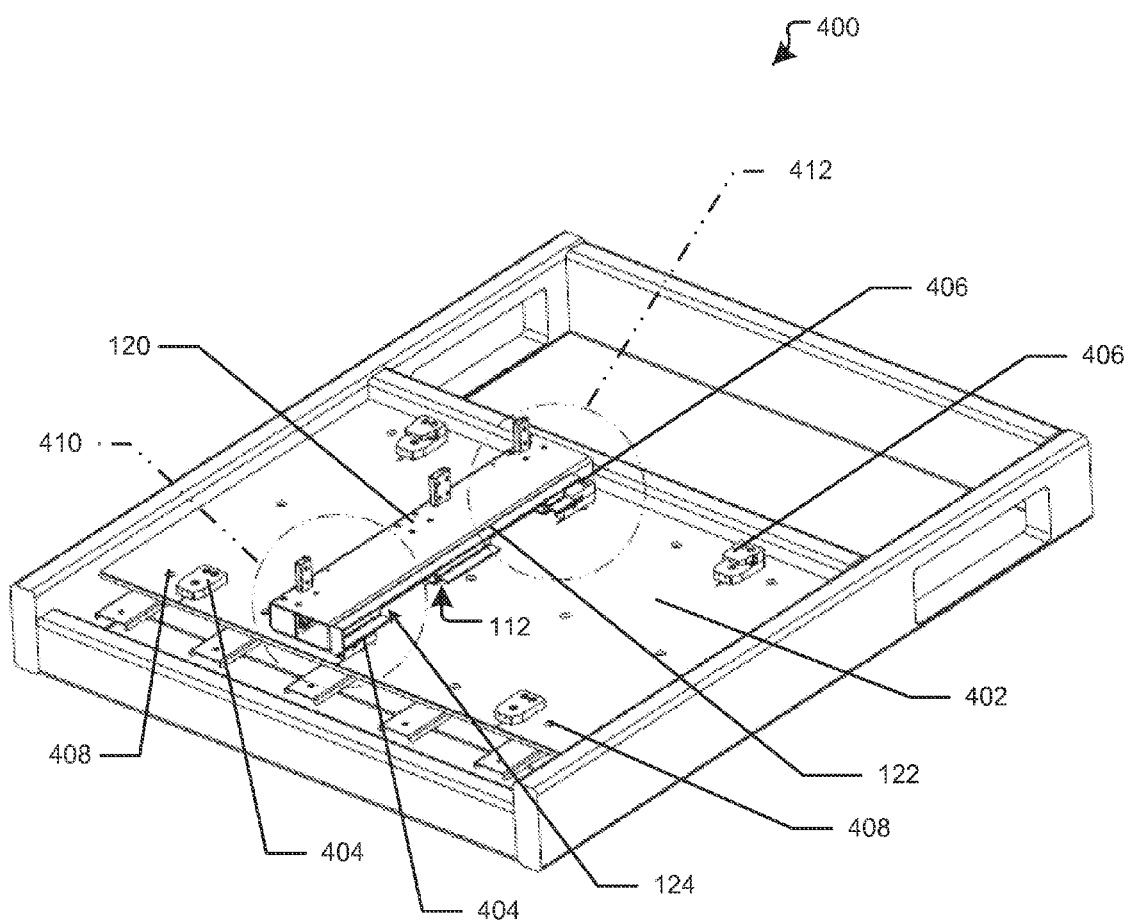
FIG. 4 is a diagram showing a three axis cut-away of the cabinet rack taken along lines A-B-C of FIG. 2 and a portion of a floor in a modular data center.
Figure 7:
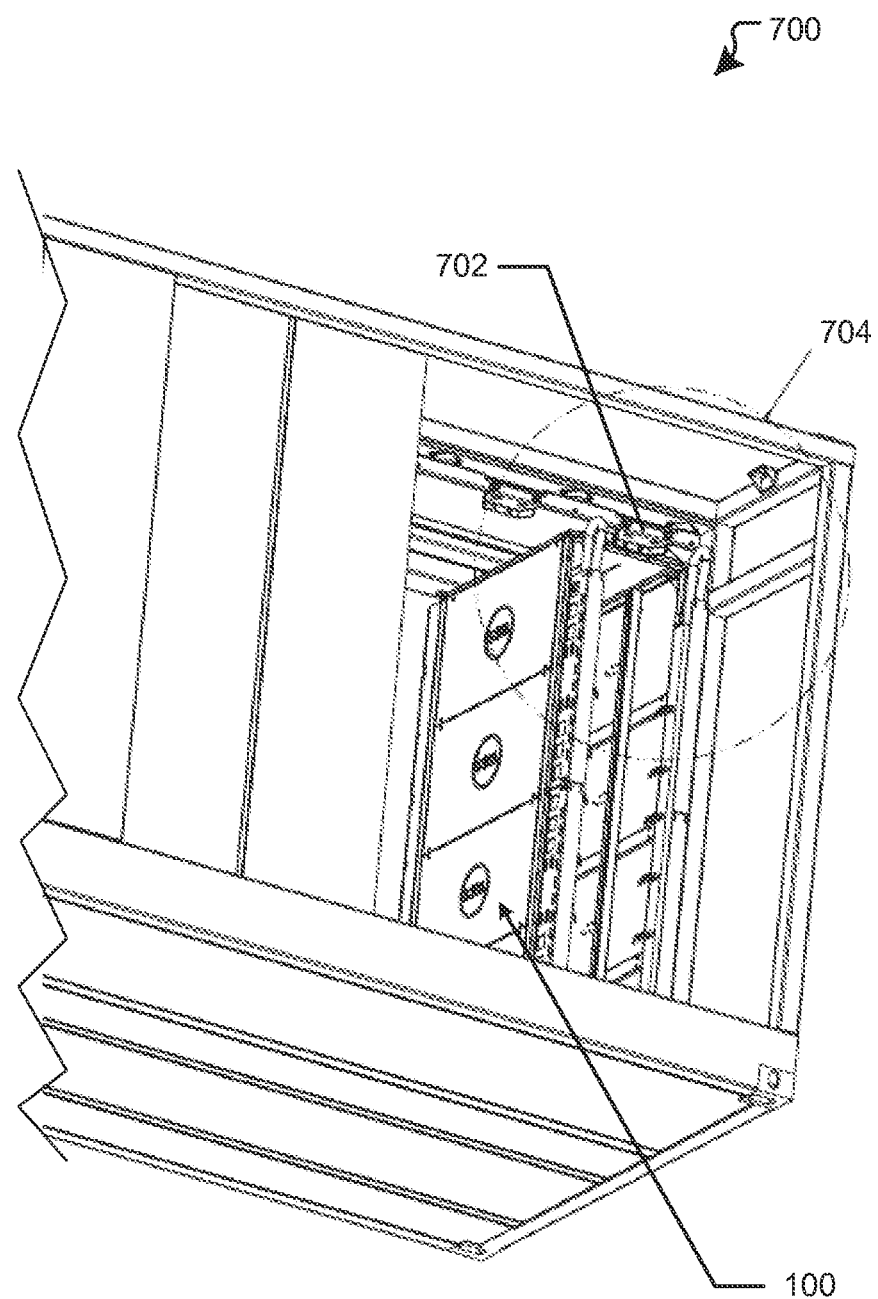
FIG. 7 is a diagram showing a perspective view of the cabinet rack within the modular data center.

FIG. 4 shows a three axis cut-away of the cabinet rack 100 taken along lines A-B-C in FIG. 2 on a floor 402 of a modular data center, such as modular data center 700 of FIG. 7. The cross section of the cabinet rack 100 includes a portion of the base 112, which in turn includes side beam 120, center beam 122, and alignment channel 124. The floor 402 includes multiple front alignment components 404, multiple back alignment components 406, and multiple mounting holes 408.

Each of the alignment components 404 and 406 can be secured in different locations on the floor 402 by being bolted or otherwise attached to the floor via one of the multiple mounting holes 408 in the floor of the modular data center. The alignment components 404 and 406 can be utilized to define rack slots within the modular data center by the combination of one front alignment component 404 and one back alignment component 406 being identified as a single rack slot in the modular data center. The mounting holes 408 in the floor 402 can be utilized to change the distance between the sets of alignment components 404 and 406, such that by increasing the distance between the sets of alignment components the number of rack slots in the modular data center decreases, and by decreasing the distance between the sets of alignment components the number of rack slots in the modular data center increases. The distance between the sets of alignment components can be defined based on the size of the server racks, such as server rack 100, being stored in the modular data center.

When the cabinet rack 100 is positioned in front of a rack slot in a modular data center that includes one front alignment component 404 and one back alignment component 406, the server rack can be pushed into its respective rack slot casters 302-312. The front alignment component 402 can slide within the alignment channel 122 of the base 112. For example, the dimensions, such as height and width, of the front alignment component 404 can designed to fit within the alignment channel 124 of the base 112 with only a slight tolerance between the front alignment component and the alignment channel. The slight tolerance can enable an individual to easily slide the cabinet rack 100 over the front alignment component 404, but still ensure proper alignment of the cabinet rack within the rack slot.

Figure 5:
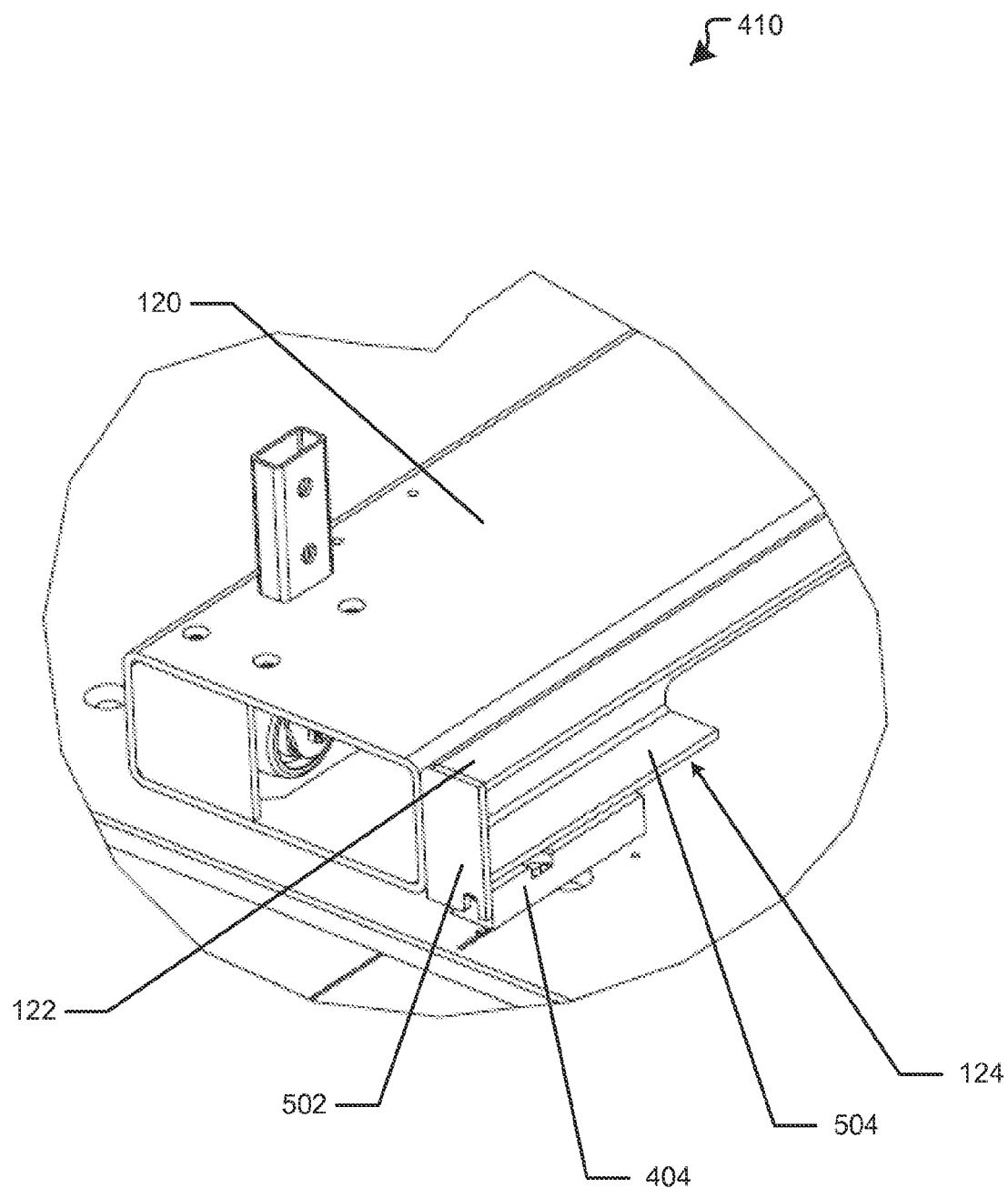
FIG. 5 is a diagram showing a perspective view of an expanded portion of the cabinet rack.

FIG. 5 shows an enlarged view of region 410 of the base 112, shown in FIG. 4. The base 112 includes the side beam 120, the alignment channel 124, and the center beam 122, which in turn includes a front panel 502 and front bottom panel 504. The front alignment component 404 can guide the cabinet rack 100 within the rack slot by the front alignment component sliding below the front bottom panel 504 and within the alignment channel 124. When the cabinet rack 100 is in a proper location within the rack slot of the modular data center, the front panel 502 of the center beam 122 can be placed alignment communication with the front alignment component 404. The front panel 502 of the center beam 122 can substantially align with the fronts of the side beam 118 and 120, such that the front edges of the side beams do not extend into a walking area within the modular data cent when the front panel 502 is in physical communication with the front alignment component 404. Additionally, the front alignment component 404 coming in contact with the front panel 502 can ensure that the cabinet rack 100 is not inserted too far within the rack slot of the modular data center.

Figure 6:
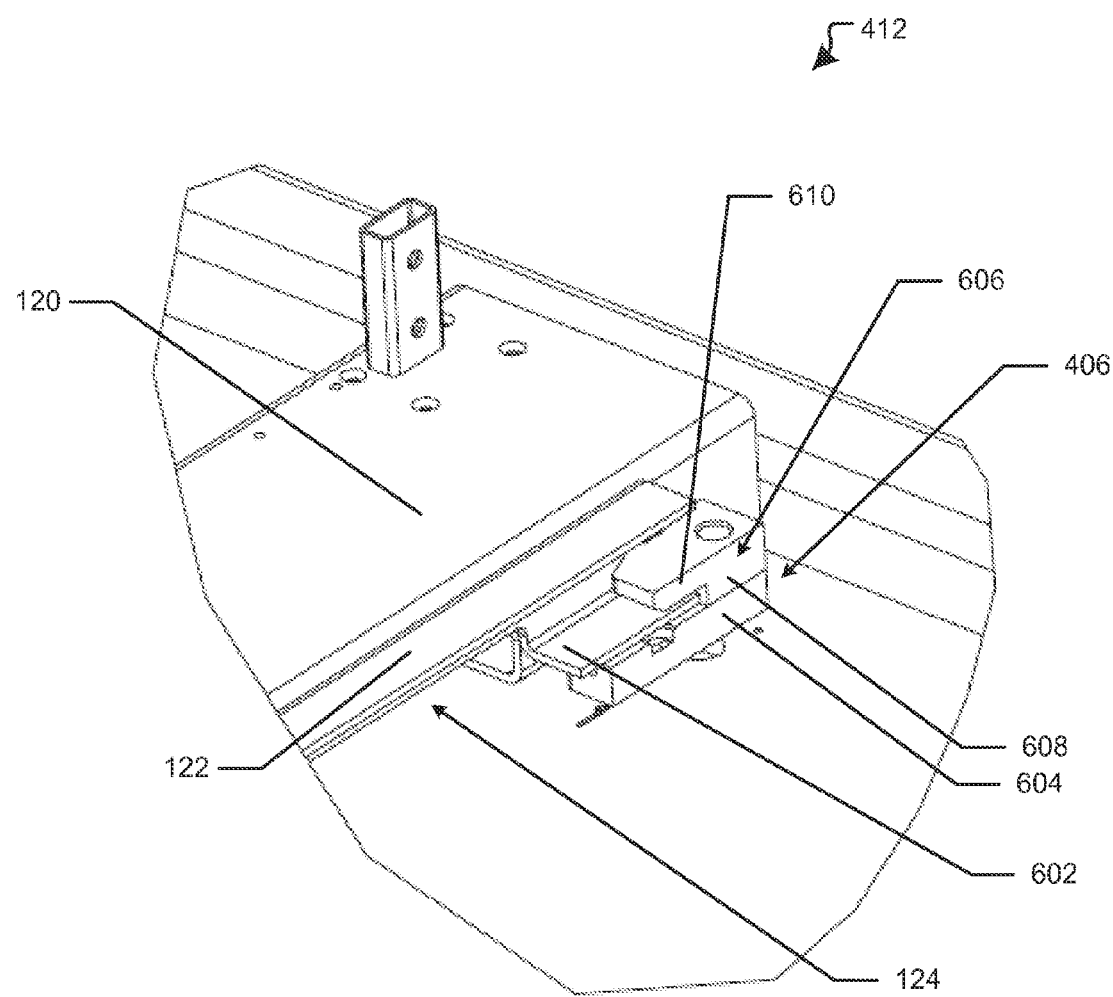
FIG. 6 is a diagram showing a perspective view of another expanded portion of the cabinet rack.

FIG. 6 shows an enlarged view of region 412 of the base 112, shown in FIG. 4. The base 112 includes the side beam 120, the alignment channel 124, and the center beam 122, which in turn includes a rear bottom panel 602. The back alignment component 406 includes a base 602 and a top 606, which in turn includes a stop portion 608 and an over-hang portion 610. The rear bottom panel 602 of the center beam 122 is substantially the same height and width as the front bottom panel 502 in FIG. 5. Thus, the front alignment component 404 can slide under the rear bottom panel 602 and in between the side beams 118 and 120 to align the cabinet rack 100 within the rack slot. The base 604 of the back alignment component 404 can also guide the cabinet rack 100 within the rack slot by the sliding below the rear bottom panel 602 and within the alignment channel 124.

When the cabinet rack 100 is located at a proper depth within the rack slot of the modular data center, the rear bottom panel 602 of the center beam 122 can be placed in physical communication with the stop portion 608 of the back alignment component 406, and the over-hang portion 610 can overlap the rear bottom panel of the base 112. A back end of the center beam 122 can offset from the back end of the side beams 118 and 120, such that the edge of the center beam does not reach the end of the side beams 118 and 120. The offset of the center beam 122 can enable the side beams 118 and 120 to slide past the back alignment component 406 and to thereby reduce space between the back of the cabinet rack 100 and the side of the modular data center. Thus, the stop portion 608 of the back alignment component 406 coming in contact with the rear bottom panel 602 can ensure that the cabinet rack 100 is not inserted too far within the rack slot of the modular data center. The over-hang portion 610 can decrease the likelihood that the cabinet rack 100 may tilt and fall over in response to the over-hang portion being located in between the rear bottom panel 602 and the top of the center beam 122.

FIG. 7 shows the cabinet rack 100 within a modular data center 700. The modular data center 700 includes a mounting bracket 702 to secure the top of the cabinet rack 100 to the top of the modular data center as shown in more detail in FIG. 8.

Figure 8:
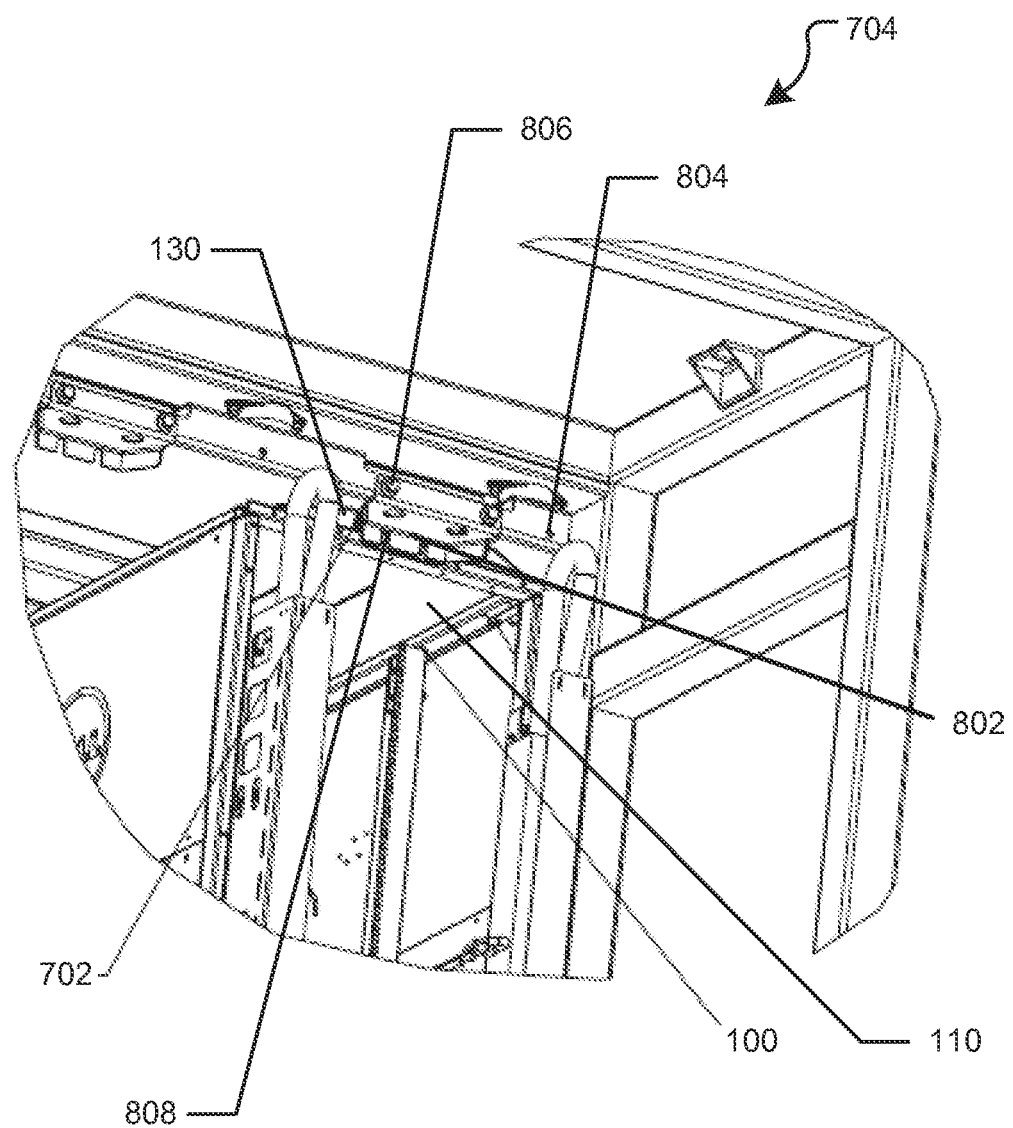
FIG. 8 is a diagram showing a perspective view of an expanded portion of the cabinet rack within the modular data center.

FIG. 8 shows an enlarged view of region 704 the cabinet rack 100 and modular data center 700, shown in FIG. 7. The modular data center 700 includes the mounting bracket 702, slots 802, and holes 804. The cabinet rack 100 includes the bracket 130. The location of the mounting bracket 702 can be adjusted along the top of the modular data center 700 based on alignment holes in the mounting bracket with the holes 804 of the modular data center and securing the mounting bracket to the modular data center via bolts 806. In an embodiment, the location of the mounting bracket 702 is preferably set to align with the front and back alignment components 404 and 406 on the floor 402 of FIG. 4 in the modular data center 700.

Thus, an individual can change the location of a rack slot by moving the mounting bracket 702 a different combination of holes 804 that correspond to the location of the front and back alignment components 404 and 406 in the modular data center 700. When the cabinet rack is inserted into the rack slot, the mounting bracket 702 can fit between two portions of the bracket 130 extending from the top 110 of the cabinet rack 100 as shown in FIG. 1. The top 110 of the cabinet rack 100 can then be connected to the modular data center 700 by the bracket 130 of the cabinet rack being securely attached to the mounting bracket 702 of the modular data center via a bolt, or any other piece of hardware. Thus, mounting bracket 702 and the alignment components 404 and 406 of the modular data center 700 can interface respectively with the bracket 130 and the base 112 of the cabinet rack 100 to properly align and securely mount the rack cabinet within the modular data center.

Although only a few exemplary embodiments have been described in detail in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. A cabinet rack comprising:
a frame including first and second sides; and
a base in physical communication with the first and second sides of the frame, the base including first, second, and third beams and an alignment channel, a top of the alignment channel defined by a front bottom panel of the first beam, a first edge of the alignment channel defined by an edge of the second beam, and a second edge of the alignment channel defined by an edge of the third beam, wherein the first edge of the alignment channel is opposite the second edge of the alignment channel, wherein the first beam is in physical communication with and located in between the second and third beams, wherein the alignment channel is configured to surround a first alignment component of a modular data center, and the first beam is configured to be placed in physical communication with a second alignment component of the modular data center in response to the cabinet rack being fully inserted with a rack slot of the modular data center.

2. The cabinet rack of claim 1 wherein the alignment channel is further configured to surround a first portion of the second alignment component and the first beam is configured to be placed in physical communication with a second portion of the second alignment component in response to the cabinet rack being fully inserted within the rack slot.

3. The cabinet rack of claim 1 further comprises:
a top of the frame; and
a bracket mounted on the top, the bracket is configured to be placed in physical communication with a mounting bracket of the modular data center.

4. The cabinet rack of claim 3 wherein the bracket is further configured to align the cabinet rack within the rack slot of the modular data center in response to the cabinet rack being fully inserted within the rack slot and to be attached to the mounting bracket to secure the cabinet rack within the rack slot.

5. The cabinet rack of claim 1 wherein
an end of the second beam extends past an end of the first beam, and the end of the second beam also extends past the second alignment component when the cabinet rack is fully inserted within the rack slot.

6. The cabinet rack of claim 1 wherein the first beam includes a front panel to be placed in physical communication with the first alignment component in response to the cabinet rack being fully inserted within the rack slot.

7. A modular data center comprising:
a first alignment component mounted at a first location on a floor of the modular data center;
a second alignment component mounted at a second location on the floor; and
a cabinet rack including:
a frame including first and second sides; and
a base in physical communication with the first and second sides of the frame, the base including first, second, and third beams and an alignment channel, a top of the alignment channel defined by a front bottom panel of the first beam, a first edge of the alignment channel defined by an edge of the second beam, and a second edge of the alignment channel defined by an edge of the third beam, wherein the first edge of the alignment channel is opposite the second edge of the alignment channel, wherein the first beam is in physical communication with and located in between the second and third beams, wherein the alignment channel is configured to surround the first alignment component and the first alignment component is to slide below the front bottom panel of the first beam, and the first beam is configured to be placed in physical communication with the second alignment component of the modular data center in response to the cabinet rack being fully inserted within a rack slot of the modular data center.

8. The modular data center of claim 7 wherein the first location of the first alignment component and the second location of the second alignment component define a location of the rack slot.

9. The modular data center of claim 7 further comprises:
a mounting bracket attached to a top of the modular data center, the mounting bracket is configured to align the cabinet rack in the rack slot and to be placed in physical communication with a bracket of the cabinet rack in response to the cabinet rack being fully inserted in the rack slot.

10. The modular data center of claim 9 wherein the bracket of the cabinet rack is mounted on a top of the frame of the cabinet rack.

11. The modular data center of claim 9 wherein the mounting bracket is further configured to be attached to the bracket to secure the cabinet rack within the rack slot.

12. The modular data center of claim 7 further comprises:
mounting holes in the floor, the mounting holes to provide a plurality of location for the first and second alignment components to be attached to the floor.

13. The modular data center of claim 7 wherein the location of the first alignment component is configured to place the first alignment component in physical communication with a front panel of the first beam of the cabinet rack when the cabinet rack is fully inserted within the rack slot.

14. The modular data center of claim 7 wherein an end of the second beam extends past an end of the first beam, and the end of the second beam also extends past the second alignment component when the cabinet rack is fully inserted within the rack slot.

* * * * *